United States Patent
Li et al.

(10) Patent No.: US 9,368,621 B1
(45) Date of Patent: Jun. 14, 2016

(54) POWER SEMICONDUCTOR DEVICE HAVING LOW ON-STATE RESISTANCE

(71) Applicant: SINOPOWER SEMICONDUCTOR, INC., Hsinchu (TW)

(72) Inventors: Po-Hsien Li, Tainan (TW); Guo-Liang Yang, Hsinchu (TW)

(73) Assignee: SINOPOWER SEMICONDUCTOR, INC., Hsinchu (TW)

( * ) Notice: Subject to any disclaimer, the term of this patent is extended or adjusted under 35 U.S.C. 154(b) by 0 days.

(21) Appl. No.: 14/555,518

(22) Filed: Nov. 26, 2014

(51) Int. Cl.
H01L 29/06 (2006.01)
H01L 29/78 (2006.01)
H01L 29/73 (2006.01)
H01L 29/40 (2006.01)
H01L 29/423 (2006.01)
H01L 29/417 (2006.01)
H01L 29/739 (2006.01)

(52) U.S. Cl.
CPC ........ *H01L 29/7827* (2013.01); *H01L 29/0696* (2013.01); *H01L 29/407* (2013.01); *H01L 29/41741* (2013.01); *H01L 29/4236* (2013.01); *H01L 29/7811* (2013.01); *H01L 29/7813* (2013.01); *H01L 29/0634* (2013.01); *H01L 29/7397* (2013.01)

(58) Field of Classification Search
CPC ............ H01L 29/0634; H01L 29/7811; H01L 29/7813; H01L 29/407; H01L 29/7397; H01L 29/0696
See application file for complete search history.

(56) References Cited

U.S. PATENT DOCUMENTS

| | | | | |
|---|---|---|---|---|
| 7,855,415 B2* | 12/2010 | Challa | .................. | H01L 21/3065 257/331 |
| 8,415,739 B2* | 4/2013 | Venkatraman | ........ | H01L 29/407 257/330 |
| 8,648,412 B1* | 2/2014 | Burke | .................. | H01L 29/7813 257/329 |
| 8,685,822 B2* | 4/2014 | Burke | .................... | H01L 29/407 257/E21.419 |
| 8,723,238 B1* | 5/2014 | Padmanabhan | ....... | H01L 29/407 257/288 |
| 8,779,510 B2* | 7/2014 | Yilmaz | ............... | H01L 29/4236 257/334 |
| 8,816,348 B2* | 8/2014 | Hsieh | .................. | H01L 27/0629 257/334 |
| 8,963,240 B2* | 2/2015 | Bhalla | .................... | H01L 29/407 257/334 |
| 2005/0145936 A1* | 7/2005 | Polzl | ...................... | H01L 29/402 257/341 |
| 2009/0111231 A1* | 4/2009 | Grebs | .................... | H01L 29/407 438/270 |

(Continued)

*Primary Examiner* — Ida M Soward
(74) *Attorney, Agent, or Firm* — Li & Cai Intellectual Property (USA) Office

(57) ABSTRACT

A power semiconductor device having low on-state resistance includes a substrate having an epitaxial layer formed thereon, a gate structure, a termination structure, and a patterned conductive layer. The epitaxial layer has at least a first trench and a second trench. The gate structure is embedded in the first trench, including a gate electrode and a shielding electrode disposed under the gate electrode. The termination structure is embedded in the second trench, including a termination electrode. The patterned conductive layer is disposed above the epitaxial layer. Specially, the shield electrode of the gate structure and the termination electrode of the termination structure are configured to receive the gate voltage. The patterned conductive layer is configured to electrically contact said gate electrode and termination electrodes by a first contact plug and a second contact plug respectively.

9 Claims, 14 Drawing Sheets

(56) References Cited

U.S. PATENT DOCUMENTS

| | | | | |
|---|---|---|---|---|
| 2009/0230465 A1* | 9/2009 | Yilmaz | ............... | H01L 29/7827 257/330 |
| 2011/0136309 A1* | 6/2011 | Grivna | ................. | H01L 29/407 438/270 |
| 2011/0136310 A1* | 6/2011 | Grivna | ................. | H01L 29/407 438/270 |
| 2011/0204440 A1* | 8/2011 | Bhalla | ................... | H01L 29/407 257/333 |
| 2011/0312138 A1* | 12/2011 | Yedinak | ............. | H01L 21/3065 438/270 |
| 2013/0001683 A1* | 1/2013 | Pan | ....................... | H01L 29/407 257/334 |
| 2013/0248982 A1* | 9/2013 | Grivna | ................ | H01L 29/7842 257/329 |
| 2014/0054686 A1* | 2/2014 | Darwish | ............. | H01L 29/7835 257/330 |
| 2014/0284710 A1* | 9/2014 | Hossain | .................. | H01L 29/36 257/330 |
| 2015/0194522 A1* | 7/2015 | Chang | ................... | H01L 29/402 257/334 |
| 2015/0206937 A1* | 7/2015 | Yedinak | .............. | H01L 29/7397 257/334 |
| 2016/0064556 A1* | 3/2016 | Qin | ................... | H01L 21/26513 257/334 |

\* cited by examiner

POWER SEMICONDUCTOR DEVICE HAVING LOW ON-STATE RESISTANCE

BACKGROUND OF THE INVENTION

1. Field of the Invention

The instant disclosure relates to a power semiconductor device; in particular, to a power semiconductor device having low on-state resistance for a power circuit.

2. Description of Related Art

Semiconductor packages are well known in the art. These packages can sometimes include one or more semiconductor devices, such as an integrated circuit (IC) device, die or chip. The IC devices can include electronic circuits that have been manufactured on a substrate made of a semiconductor material. The circuits are made using many known semiconductor processing techniques such as deposition, etching, photolithography, annealing, doping and diffusion. Silicon wafers are typically used as the substrate on which these IC devices are formed.

An example of a semiconductor device is a metal oxide semiconductor field effect transistor (MOSFET) device, which is used in numerous electronic apparatuses including power supplies, automotive electronics, computers and battery powered devices like mobile phones. MOSFET devices can be used in a variety of applications such as switches that connect power supplies to particular electronic devices having a load. MOSFET devices can be formed in a trench that has been etched into a substrate or onto an epitaxial layer that has been deposited onto a substrate.

MOSFET devices operate by applying an appropriate voltage to a gate electrode of a MOSFET device which turns the device on and forms a channel connecting a source and a drain of the MOSFET allowing a current to flow. Once the MOSFET device is turned on, the relationship between the current and the voltage is nearly linear which means that the device behaves like a resistor. For MOSFET devices, large RDS(on) may cause larger power consumption, and the RDS(on) of a transistor usually can be simulated and calculated. It is desirable to have low drain-to-source resistance RDS(on).

To reduce the drain-to-source on-resistance RDS(on) in MOSFET devices, numerous novel structures have been proposed and implemented.

SUMMARY OF THE INVENTION

The object of the instant disclosure is to provide a power semiconductor device having low on-state resistance, in which a wide channel of electric current can be formed between any two trench gate structures to reduce Racc.

In order to achieve the aforementioned objects, according to an embodiment of the instant disclosure, a power semiconductor device having low on-state resistance is provided. The power semiconductor device having low on-state resistance includes a substrate, an epitaxial layer, a gate structure, a termination structure, an interlayer dielectric layer, and a patterned conductive layer. The substrate has a conductive gate area defined thereon. The epitaxial layer is disposed on the substrate. The epitaxial layer has at least a first trench and a second trench. The gate structure is disposed in the first trench, and the termination structure is disposed in the second trench. The gate structure includes a gate electrode, a shield electrode disposed under the gate electrode, and an insulating dielectric over the gate and shield electrodes. The termination structure includes a termination electrode and an insulating dielectric over the termination electrode. The shield electrode of the gate structure and the termination electrode of the termination structure are configured to tie a gate voltage source. A body region is formed in epitaxial layer and around the first and second trenches. The interlayer dielectric layer is disposed above the body region. The patterned conductive layer is disposed on the interlayer dielectric layer. The patterned conductive layer is configured to electrically contact the gate electrode of the gate structure and the termination electrode of the termination structure in the conductive gate area by a first contact plug and a second contact plug respectively.

Base on the above, the power semiconductor device having low on-state resistance of the present invention can be preferably applied to the charged battery. In addition, the present power semiconductor device can be miniaturized based on its new device layout with novel gate and termination structures.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

BRIEF DESCRIPTION OF THE DRAWINGS

FIG. 7 is schematic cross-sectional views showing a channel of electric current when the power semiconductor device having low on-state resistance is turned on;

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

The present invention is directed to an innovative power semiconductor device. To advance miniaturization, the device layout is constituted by a rectangular-shaped trench termination structure and at least two stripe-shaped trench gate structures disposed inside the trench termination structure.

Moreover, the trench termination structure includes a termination gate and an insulating dielectric disposed between the termination gate and the sidewalls of the trench, and each trench gate structure includes a gate electrode and a shielding electrode disposed under the gate electrode. Accordingly, the thick-film oxide layer, in the non-conducting state, can be subjected to high electric field to improve the breakdown voltage. Thus, the concentration of the epitaxial layer can be increased to reduce the on-state resistance.

Most importantly, the shielding electrode of each gate structure and the termination electrode of the termination structure are designed to receive a gate voltage, so that an electric current is in close proximity to each gate structure when the device is turned on. Therefore, a wide channel of electric current can be formed between the two adjacent trench gate structures to reduce the pitch-off effect.

Figure 1:
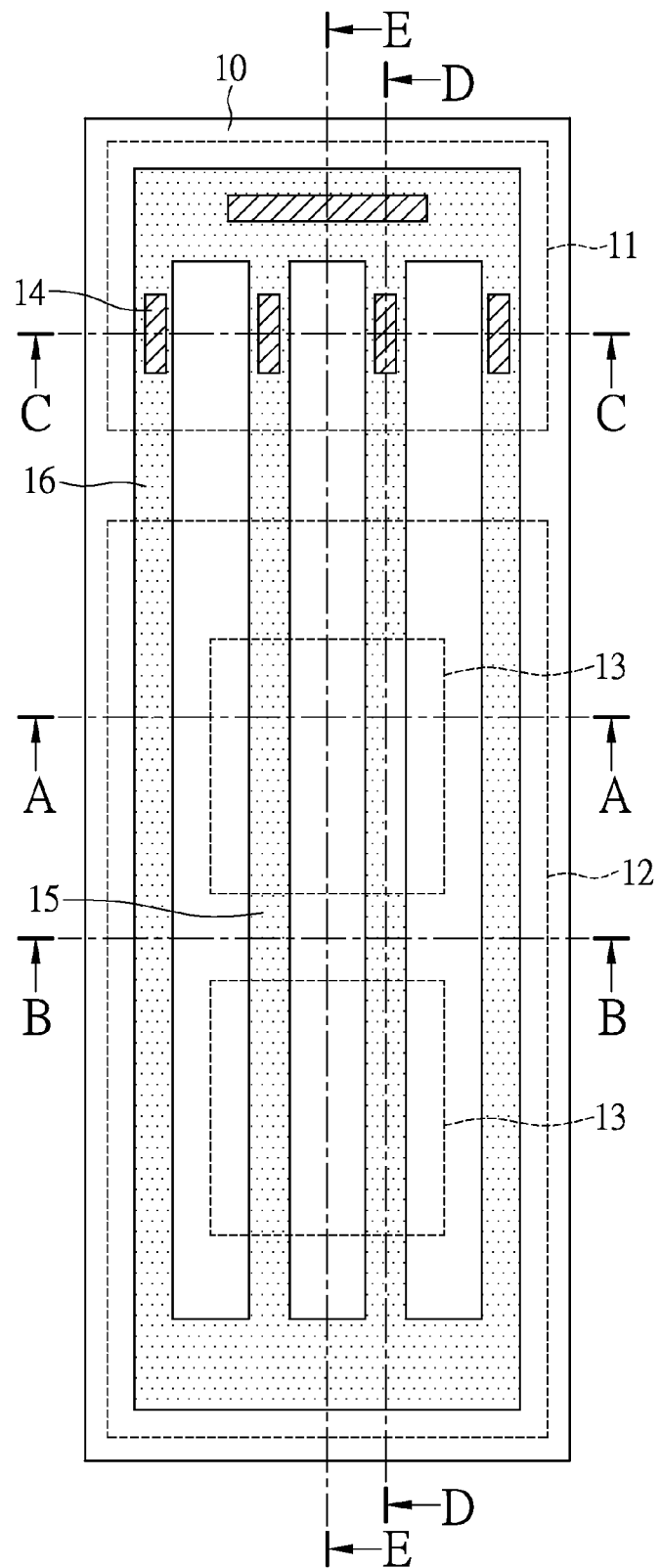
FIG. 1 is a schematic diagram illustrating a layout of a power semiconductor device having low on-state resistance according to a preferred embodiment of the present invention.

Please refer to FIG. 1 as well as FIGS. 2-6. FIG. 1 is a schematic diagram illustrating a layout of a power semiconductor device having low on-state resistance according to a preferred embodiment of the present invention. FIGS. 2-6 are schematically cross-sectional views of the power semiconductor device having low on-state resistance shown in FIG. 1 along different cutting lines.

As shown in FIG. 1, to illustrate the specific locations of gate and source metal layers, a plurality of source and heavy body regions, and a plurality of contact plugs in the following description, a conductive gate area 11, a conductive source area 12, a plurality of active areas 13, and a plurality of contact areas 14 are defined on a semiconductor substrate 10. Moreover, two stripe-shaped trenches which extend in parallel are cell trenches 15. A rectangular-shaped trench around the two stripe-shaped trenches is termination trench 16. Specially, each of the cell trenches is configured to accommodate a gate structure. The termination trench is configured to accommodate a termination structure.

Figure 2:
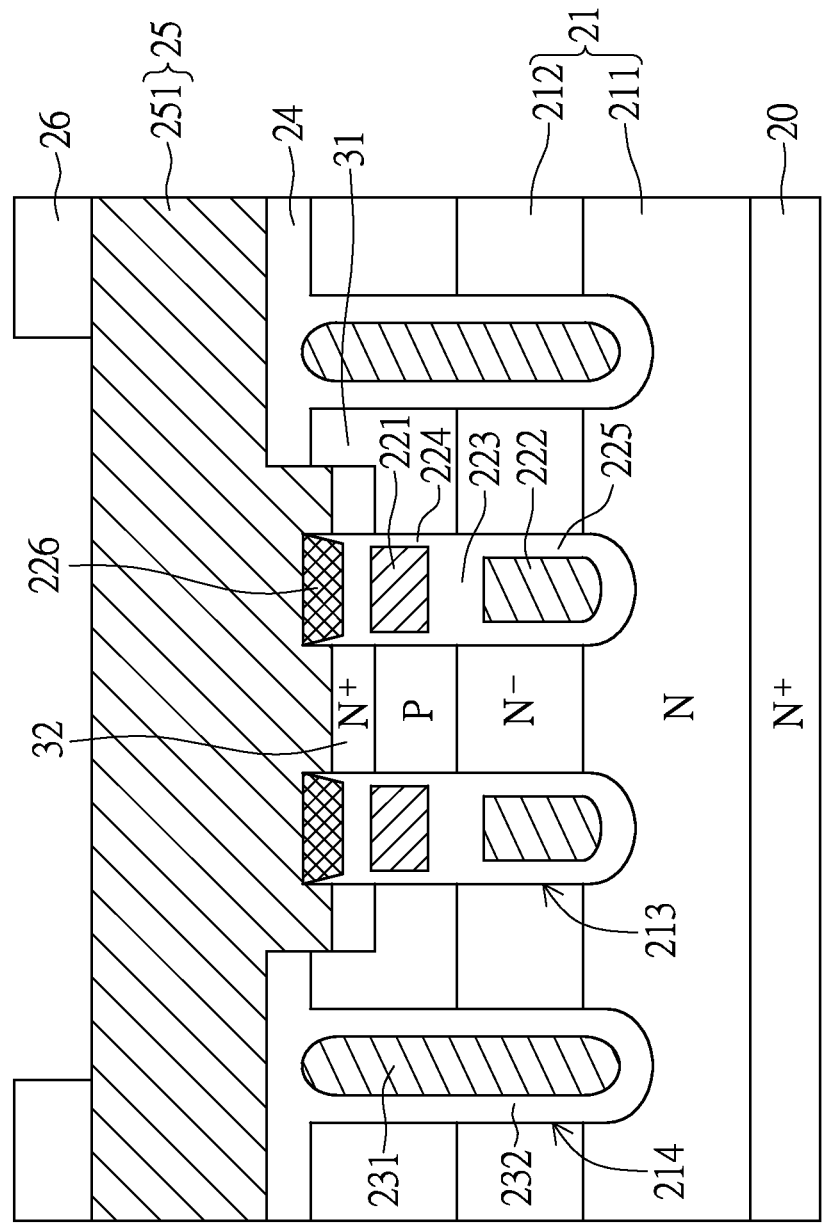
FIG. 2 is a schematic cross-sectional view along a line A-A of FIG. 1.
Figure 3:
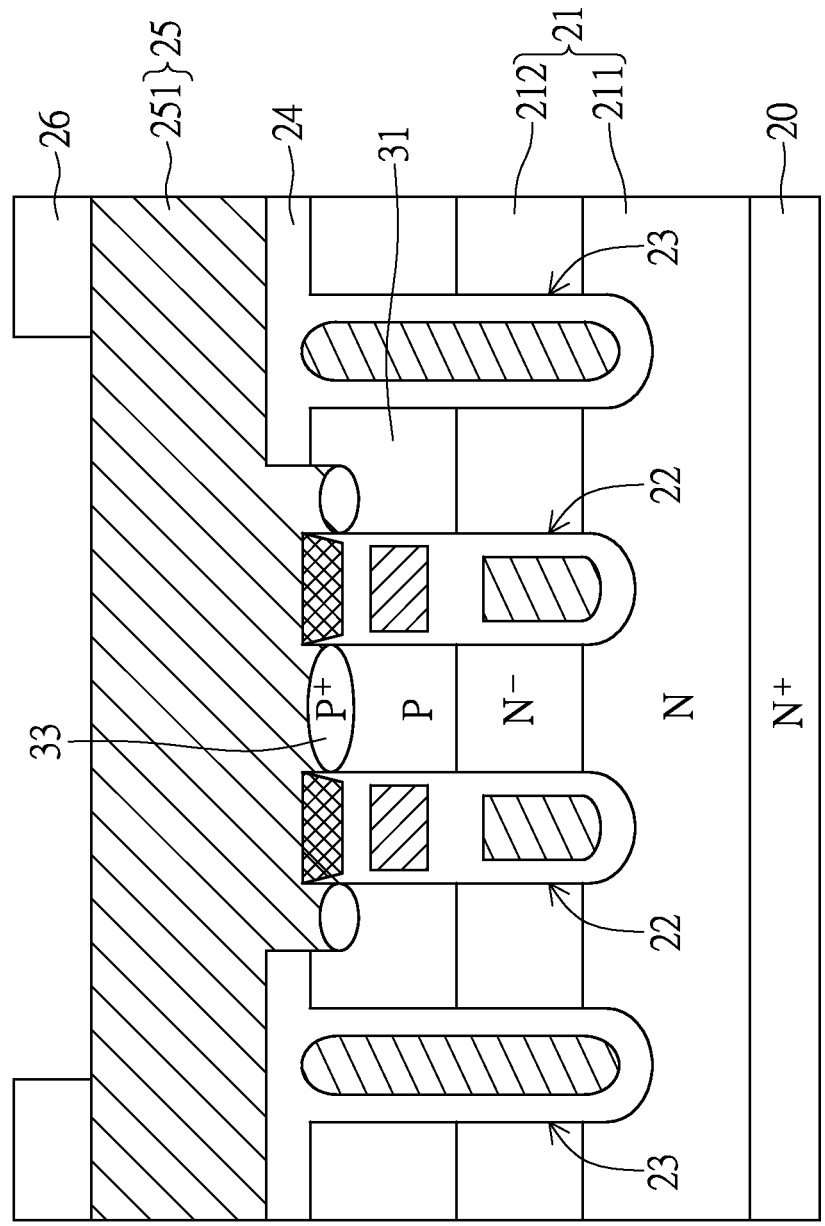
FIG. 3 is a schematic cross-sectional view along a line B-B of FIG. 1.
Figure 4:
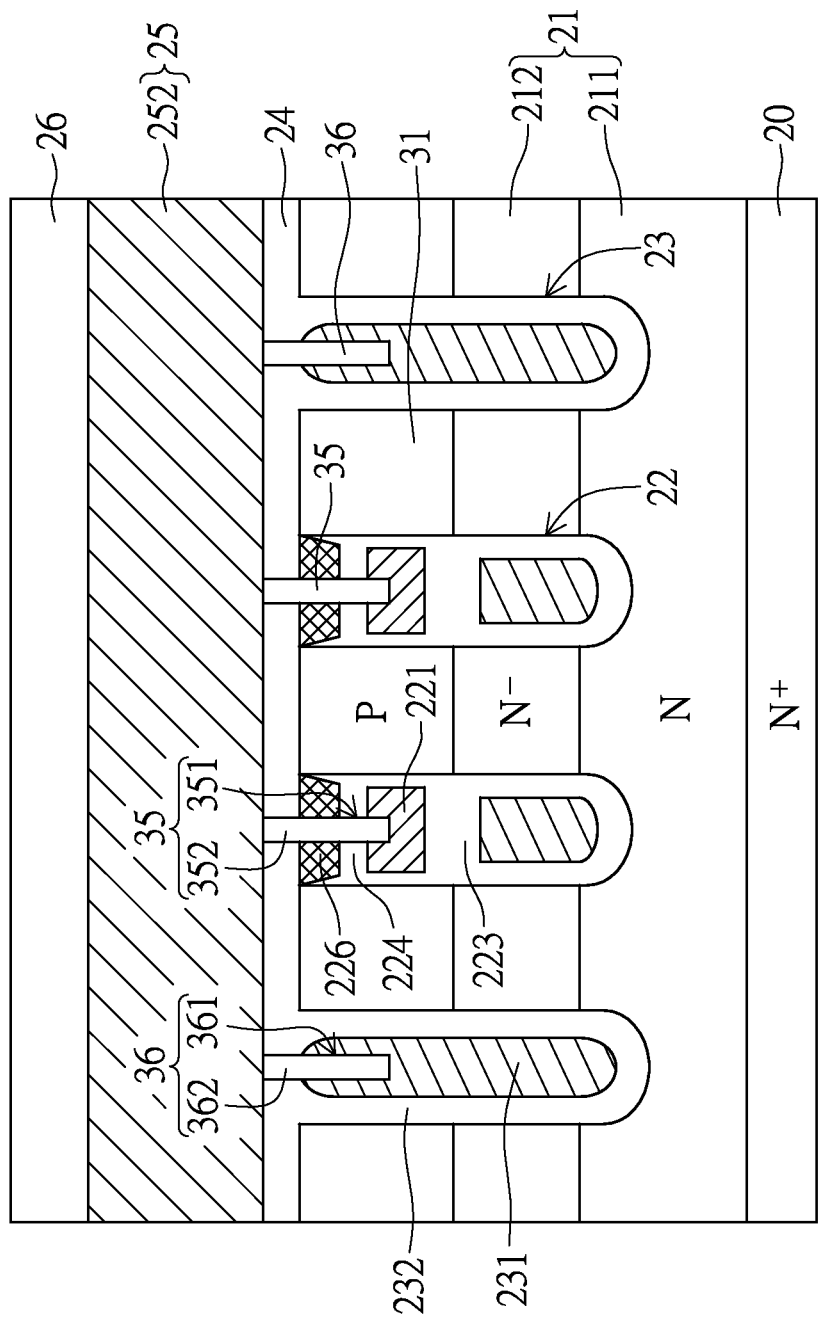
FIG. 4 is a schematic cross-sectional view along a line C-C of FIG. 1.

For clearly describe the structural features of the power semiconductor device having low on-state resistance in this embodiment, refer to FIG. 2 through FIG. 4. FIG. 2 is a schematic cross-sectional view along a line A-A of FIG. 1. FIG. 3 is a schematic cross-sectional view along a line B-B of FIG. 1. FIG. 4 is a schematic cross-sectional view along a line C-C of FIG. 1. As shown in figures above, the power semiconductor device includes a substrate 20, an epitaxial layer 21, at least one gate structure 22, at least one termination structure 23, an interlayer dielectric layer 24, a patterned conductive layer 25, and a passivation layer 26.

Specifically, the substrate 20 has a conductive gate area 11 defined thereon and a conductive source area 12 at a distance of the conductive gate area 11. The substrate 20 may be a semiconductor substrate which can serve as a drain electrode layer. The epitaxial layer 21 is formed on the substrate 20, and both of the epitaxial layer 21 and the substrate 20 have a first conductivity type such as n-type or p-type. In this embodiment, the first conductive type is, but is not limited to, n-type, and the doping concentration of the substrate 20 is greater than that of the epitaxial layer 21.

The epitaxial layer 21 can be divided into two sub layers based on its doping concentration. Specifically, the epitaxial layer 21 can be divided into a first epitaxial layer 211 disposed on the substrate 20 and a second epitaxial layer 212 disposed on the first epitaxial layer 211. It should be noted that the substrate 20 (ex. N+ substrate 20) has a higher doping concentration than the first epitaxial layer 211 (ex. N epitaxial layer 21), and the first epitaxial layer 211 has a higher doping concentration than the second epitaxial layer 21 (ex. N− epitaxial layer 21). Accordingly, the lateral current flow can be promoted when at least two connected power semiconductor devices of a package are in a conducting state.

Figure 5:
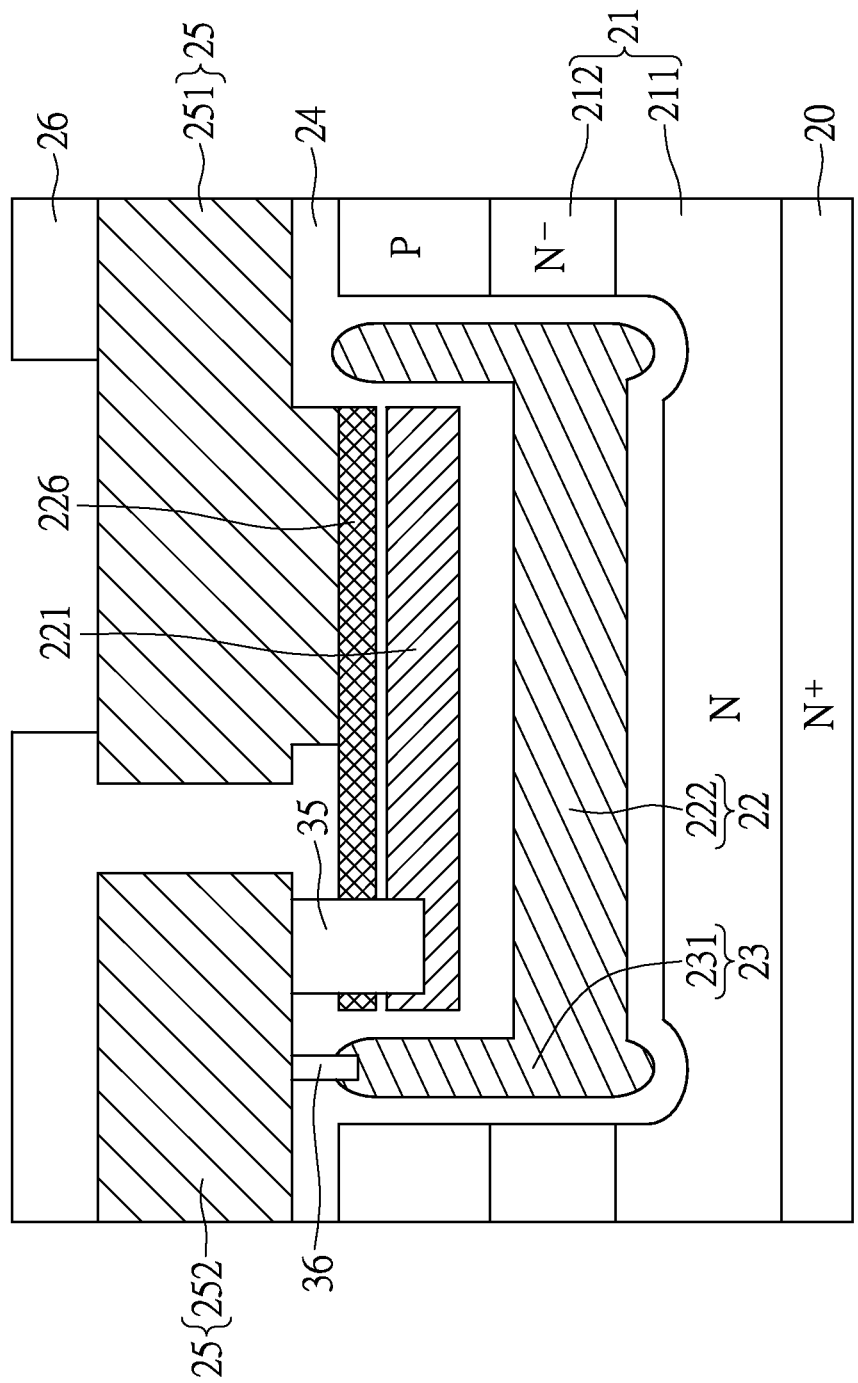
FIG. 5 is a schematic cross-sectional view along a line D-D of FIG. 1.
Figure 6:
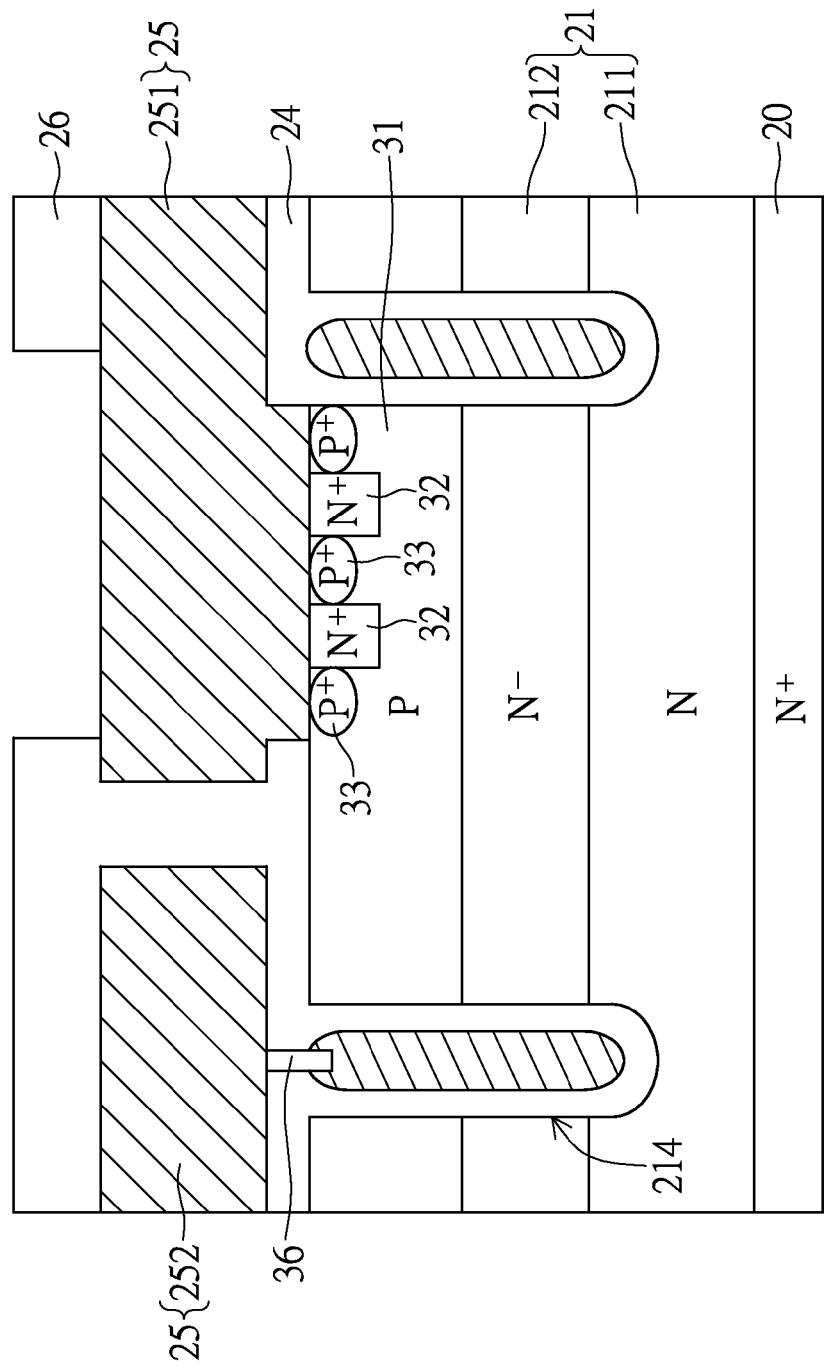
FIG. 6 is a schematic cross-sectional view along a line E-E of FIG. 1.

Refer to FIG. 5 and FIG. 6. FIG. 5 is a schematic cross-sectional view along a line D-D of FIG. 1. FIG. 6 is a schematic cross-sectional view along a line E-E of FIG. 1. As shown in figures above, the epitaxial layer 21 has at least a first trench 213 and at least a second trench 214. Preferably, the first and second trenches 213, 214 extend through the second epitaxial layer 212 and a portion of the first epitaxial layer 211. Two ends of the first trench 213 are connected to the second trench 214. A width of the second trench 214 may be greater than a width of the first trench 213.

To clarify the method of forming the first and second trenches 213, 214, firstly, a photoresist material is spin-coated on the epitaxial layer 21 in the first place. Next, the photoresist material is exposed and developed through a patterned mask to form a patterned photoresist layer (not shown). After that, an etching process is conducted to form the first and second trenches 213, 214 with the patterned photoresist layer as an etch mask.

Referring again to FIG. 2 through FIG. 6, the gate structure 22 disposed in the first trench 213 includes a gate electrode 221, a shield electrode 222 disposed under the gate electrode 221, and an insulating dielectric over the gate and shield electrodes 221, 222. In a preferred embodiment, the gate structure 22 further includes a cap stripe 226. The cap stripe 226 is disposed on the gate electrode 221, and the cap stripe 226 can be made of silicon nitride ($Si_3N_4$). Thereby, preventing the underlying gate electrode 221 from over etching or any other damages. Besides, the cap stripe 226 can acts as a self-aligned hard mask to etch silicon.

Specifically, the shield electrode 222 and the overlying gate electrode 221 are embedded in the first trench 213. The gate and shield electrodes 221, 222 may comprise doped polysilicon. There is an interelectrode dielectric layer 223 disposed between the shield electrode 222 and the gate electrode 221, thus the shielding and gate electrodes 221, 222 are insulated from each other. There is an insulating dielectric layer 224 disposed on the upper sidewalls of the first trench 213 and a shield dielectric layer 225 disposed on the lower sidewalls of the first trench 213. Accordingly, the gate and shield electrodes 221, 222 are insulated from the surrounding n-doped epitaxial layer 21.

Figure 7:
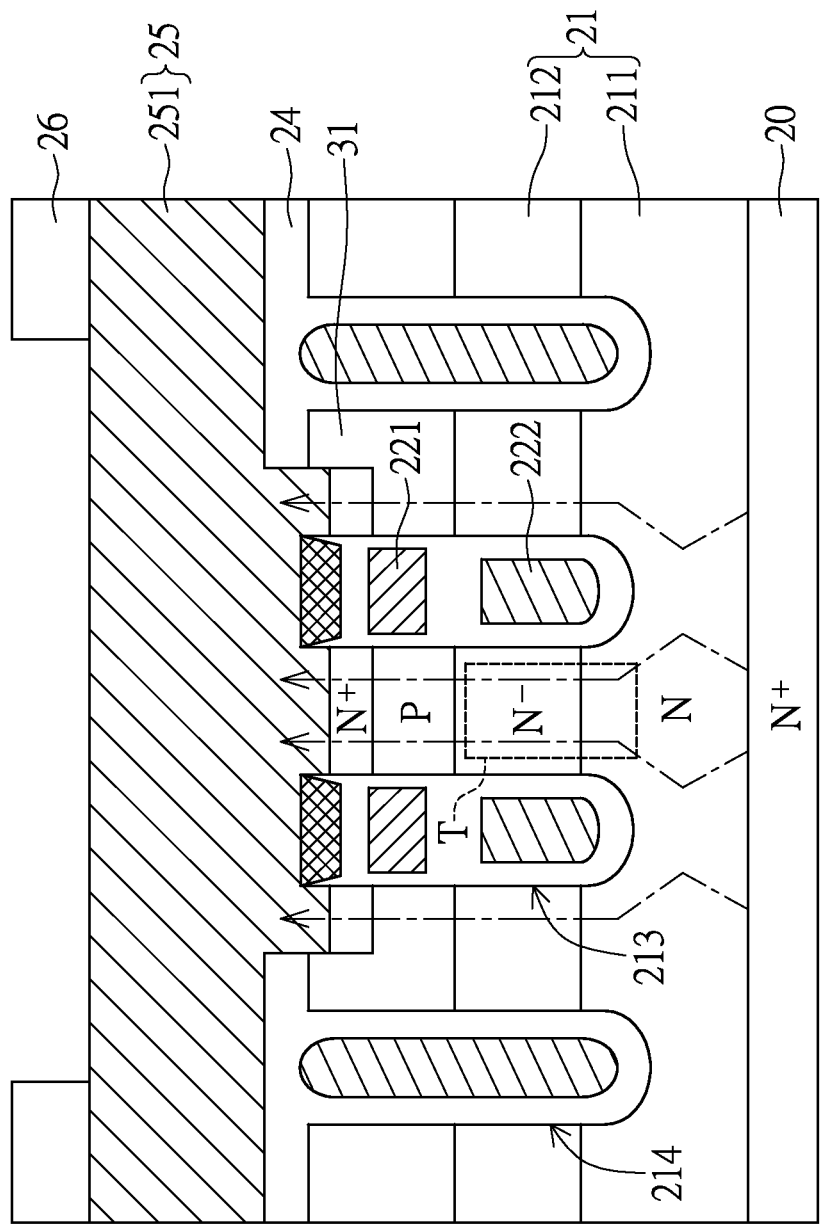

The termination structure 23 disposed in the second trench 214 includes a termination electrode 231 and an insulating dielectric over the termination electrode 231. Specifically, the termination electrode 231 is embedded in the second trench 214, and the termination electrode 231 may comprise doped polysilicon. The insulating dielectric is disposed between the termination electrode 231 and the sidewalls of the second trench 214. In practice, the shield electrode 222 is electrically tied to the termination electrode 231 (shown in FIG. 5), and both of the shielding and termination electrodes 222, 231 are configured to receive an external gate voltage. Accordingly, a wide channel T of electric current, as shown in FIG. 7, can be formed between the two adjacent gate structures 22, and an electric current is in close proximity to each gate structure 22. Hence, the narrow channel effect (pitch-off effect) can be reduced.

Figure 8:
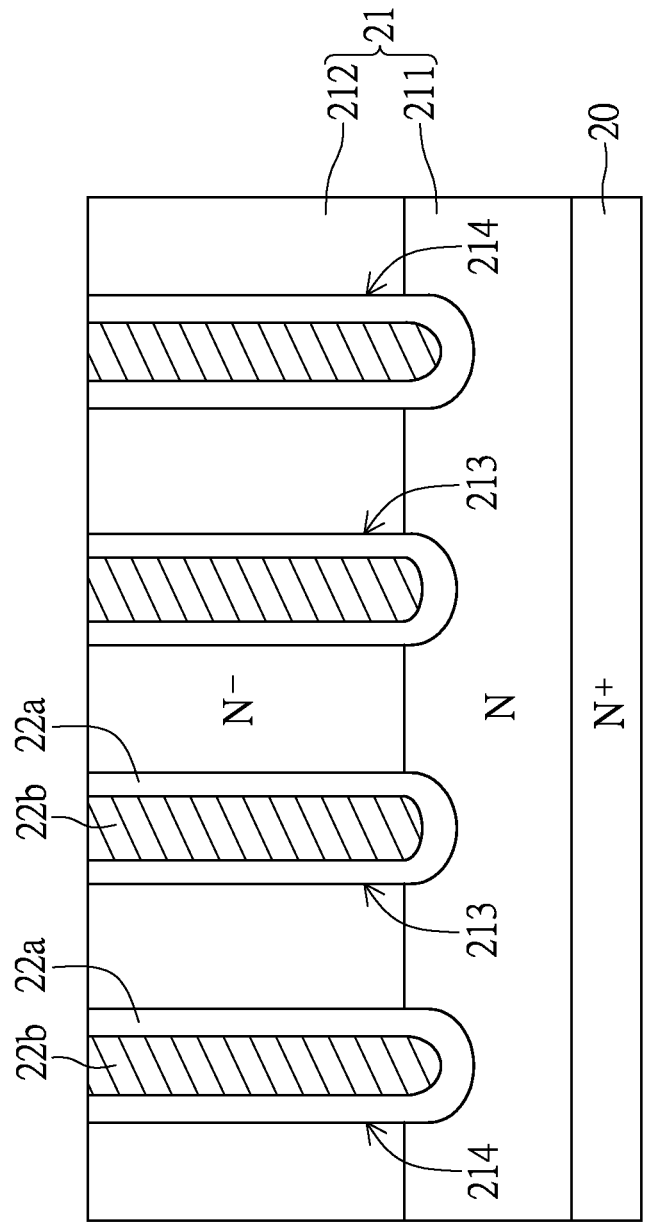
FIGS. 8-11 are schematic cross-sectional views illustrating the method of forming the gate and termination structures.

To clarify the method of forming the gate and termination structures 22, 23, refer to FIG. 8 through FIG. 11, which are cross-sectional views illustrating the processing steps of the method. As shown in FIG. 8, first of all, a process of thermal oxidation or chemical vapor deposition is conducted to form a first insulating dielectric 22a on the sidewalls of the first and second trenches 213, 214. The first insulating dielectric 22a may include, for example, silicon oxide or any other suitable material.

Next, a first conductive layer 22b is formed to fill up the first and second trenches 213, 214. The first conductive layer 22b can be, but is not limited to, a doped polysilicon layer that is deposited directly. Alternatively, the first conductive layer 22b can be formed by firstly depositing an intrinsic polysilicon layer to fill up the first and second trenches 213, 214, and then conducting an implantation process to dope the intrinsic polysilicon layer. Moreover, a thermal driving process can be selectively performed after implantation is completed.

Figure 9:
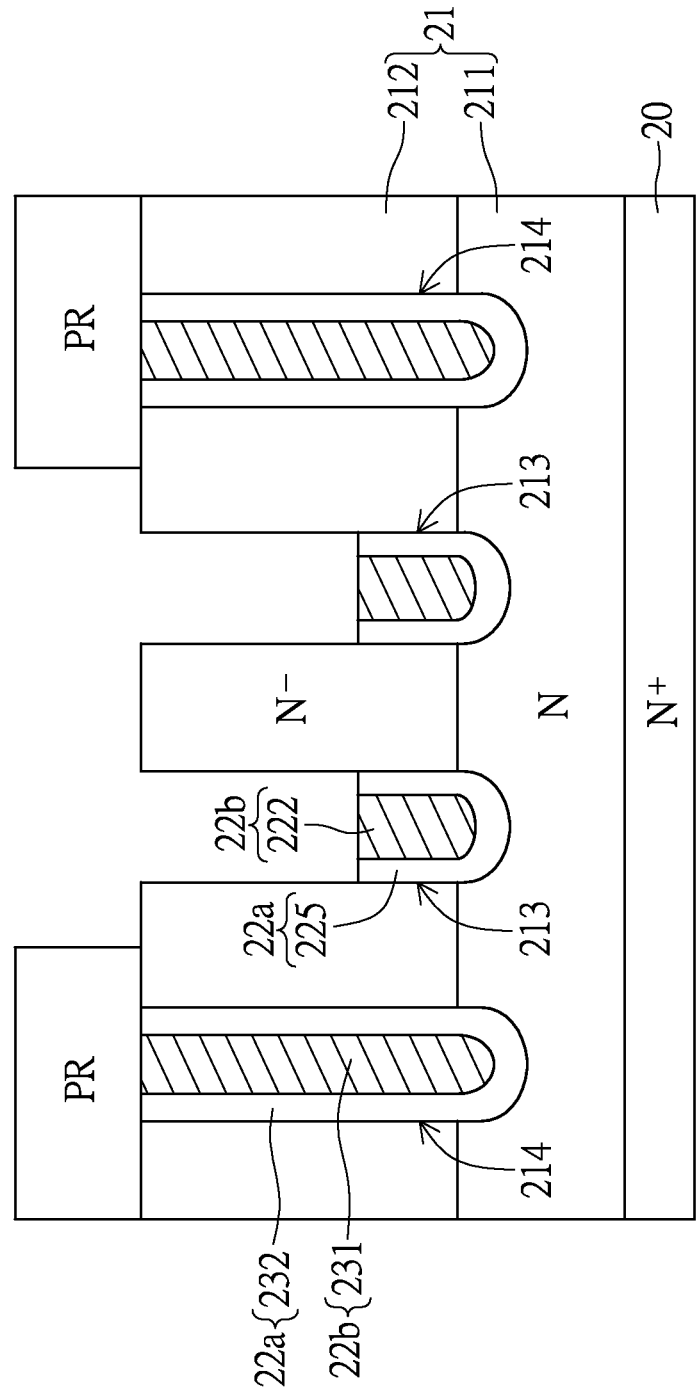

Next, as shown in FIG. 9, a patterned photoresist layer is formed over the second trenches 214, and a subsequent etching process is performed on the uncovered first insulating dielectric 22a and the uncovered first conductive layer 22b. Thus, a portion of the first conductive layer 22b inside the first trench 213 is removed, and a portion of the first insulating dielectric 22a on the upper sidewalls of the first trench 213 is concurrently removed. Consequently, the shield electrode 222 is formed in the first trench 213, and the shield dielectric layer 225 is formed on the lower sidewalls of the first trench 213 to cover the shield electrode 222. The termination electrode 231 is formed in the second trench 214, and the insulating layer 232 is formed on the overall sidewalls of the second trench 214 to cover the termination electrode 231, thereby forming the termination structure 23. The patterned photoresist layer is removed after etch is complete.

Figure 10:
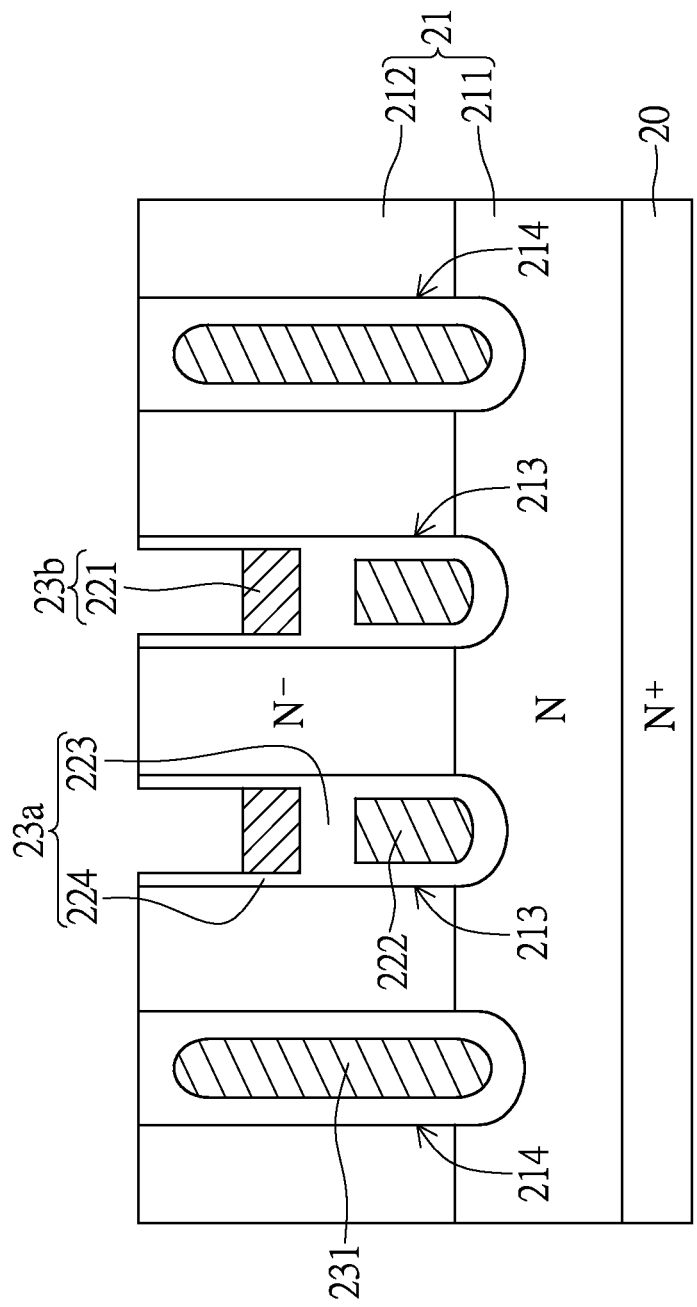

Next, as shown in FIG. 10, a second insulating dielectric 23a is deposited along the topography of the first and second trenches 213, 214, so that the shield and termination electrodes 222, 231 and the upper sidewalls of the first trench 213 are overlaid by the second insulating dielectric 23a. The second insulating dielectric 23a may include, for example, silicon oxide or any other suitable material such as a combination of a low temperature oxide and a high temperature oxide. After that, a second conductive layer 23b is formed to fill up the first trench 213 via deposition and etch back processes. The second conductive layer 23b can be, but is not limited to, a doped polysilicon layer. The second conductive layer 23b can be formed in the same way as the first conductive layer 22b. Consequently, the gate electrode 221 is formed above the shield electrode 222. The interelectrode dielectric layer 223 is formed between the gate and shield electrodes 221, 222. The gate dielectric layer 224 is formed on the upper sidewalls of the first trench 213.

Figure 11:
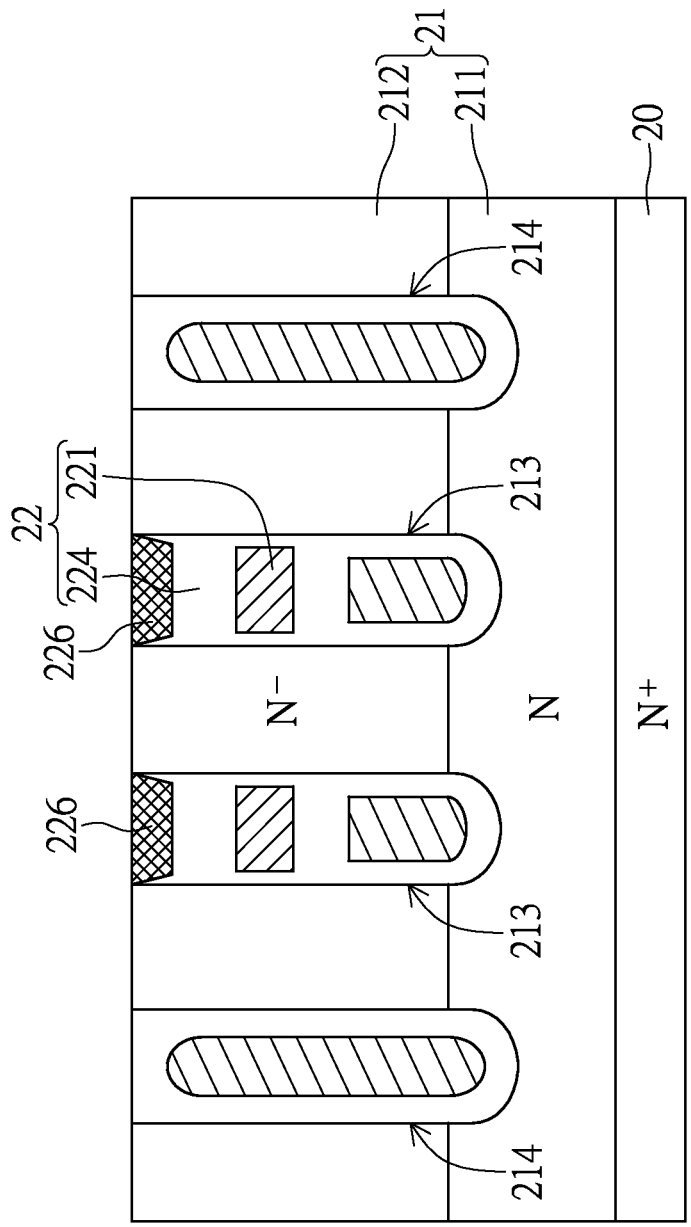

Next, as shown in FIG. 11, the cap stripe 226 is formed to fill up the recessed top surface of the insulating dielectric layer 224 to form a common plane with the top surface of the second epitaxial layer 212. In practice, a silicon oxide layer ($SiO_2$) is firstly deposited over the top surface of the second epitaxial layer 212. wherein the recesses defined by the insulating dielectric layer 224 are half-full of the silicon oxide layer respectively. A process of dry etching is then conducted to remove the exposed silicon oxide layer that acts as a buffer layer. Next, a silicon nitride layer ($Si_3N_4$) is deposited to fill up the recessed top surface of the insulating dielectric layer 224, then etch back $Si_3N_4$ to the silicon surface. The remaining $Si_3N_4$ in trench can form the cap stripe 226 above the gate electrode 221. Consequently, the gate structure 22 is formed inside the first trench 213.

Referring again to FIG. 1 through FIG. 3 together with FIG. 6, the second epitaxial layer 212 has at least a body region 31 formed therein and around the first and second trenches 213, 214. The body region 31 has a second conductive type which is different from the first conductive type. In a preferred embodiment, the first conductive type of the substrate 20 and the epitaxial layer 21 is n-type, and thus the second conductive type of the body region 31 is p-type. Moreover, there is a plurality of source regions 32 disposed in the body region 31 and at intervals of the first trench 213 (shown in FIG. 1 and FIG. 2). There is a plurality of heavy body regions 33 disposed at intervals of the first trench 213 along a first direction and the source regions 32 along a second direction which is perpendicular to the first direction (shown in FIG. 3 and FIG. 6).

Specifically, the source regions 32 can serve as the active areas in the device layout (shown in FIG. 1). Each source region 32 has the first conductive type (n-type), configured to be heavily doped to form ohmic contacts for the patterned conductive layer 25. Each heavy body region 33 has the second conductive type (p-type), configured to be heavily doped to produce an electric potential difference across the device's terminals.

Figure 12:
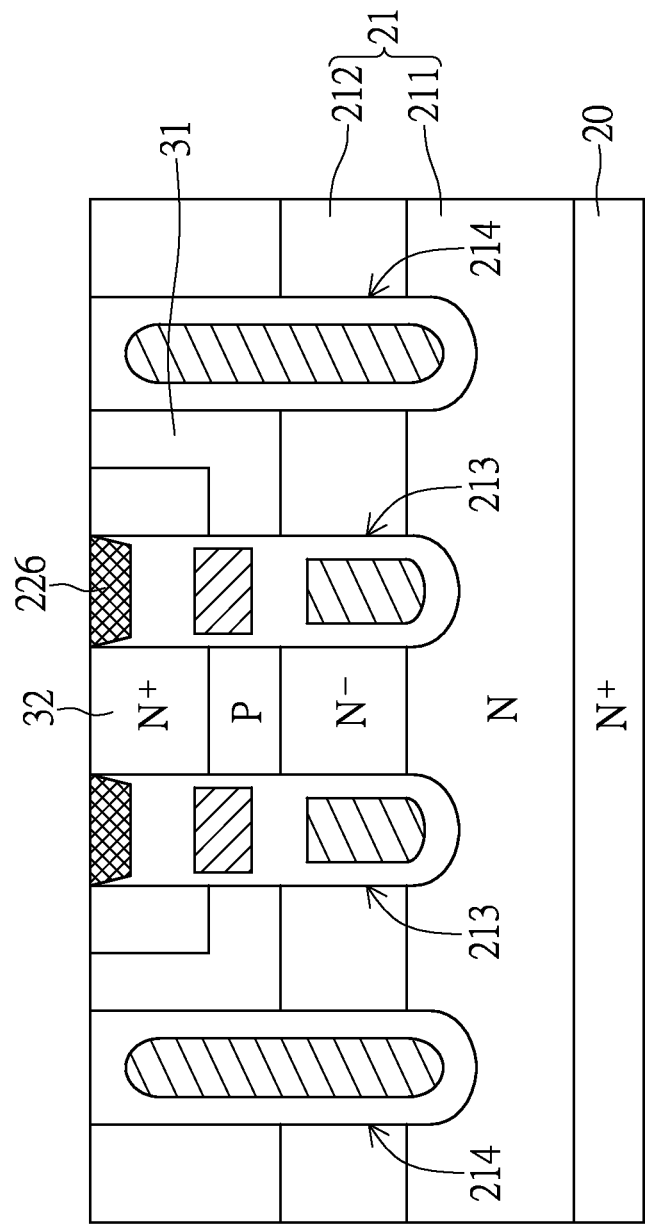
FIGS. 12-14 are schematic cross-sectional views illustrating the method of the body, source, and heavy body region.
Figure 13:
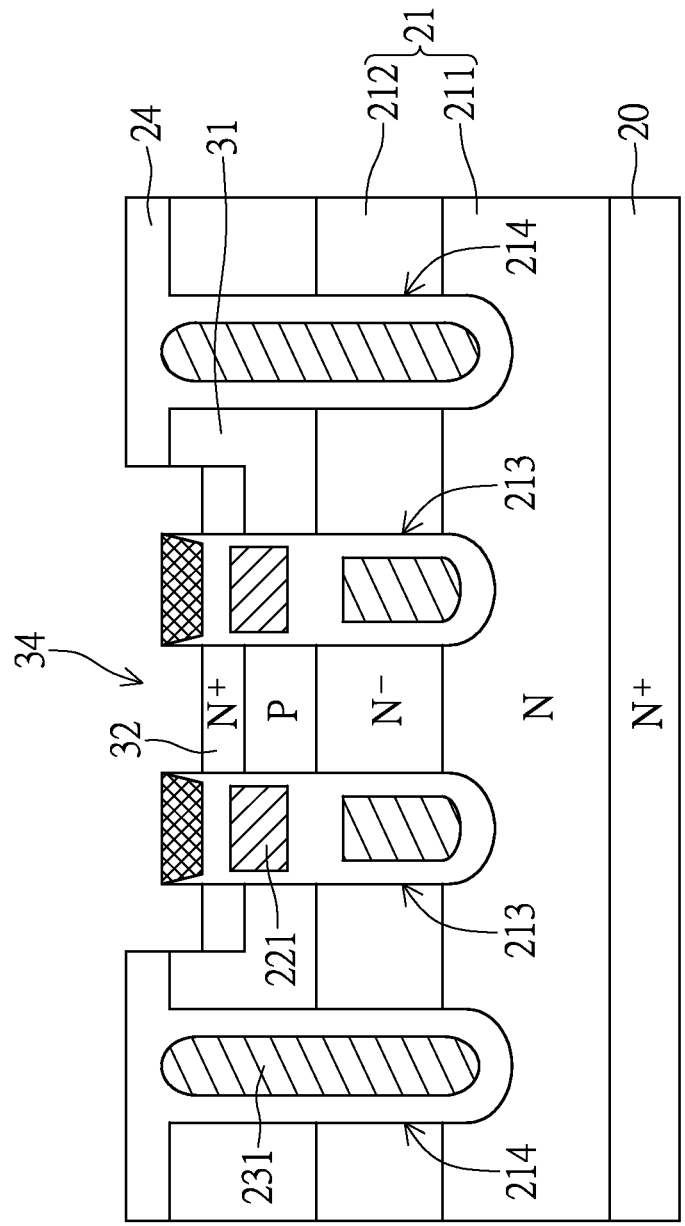
Figure 14:
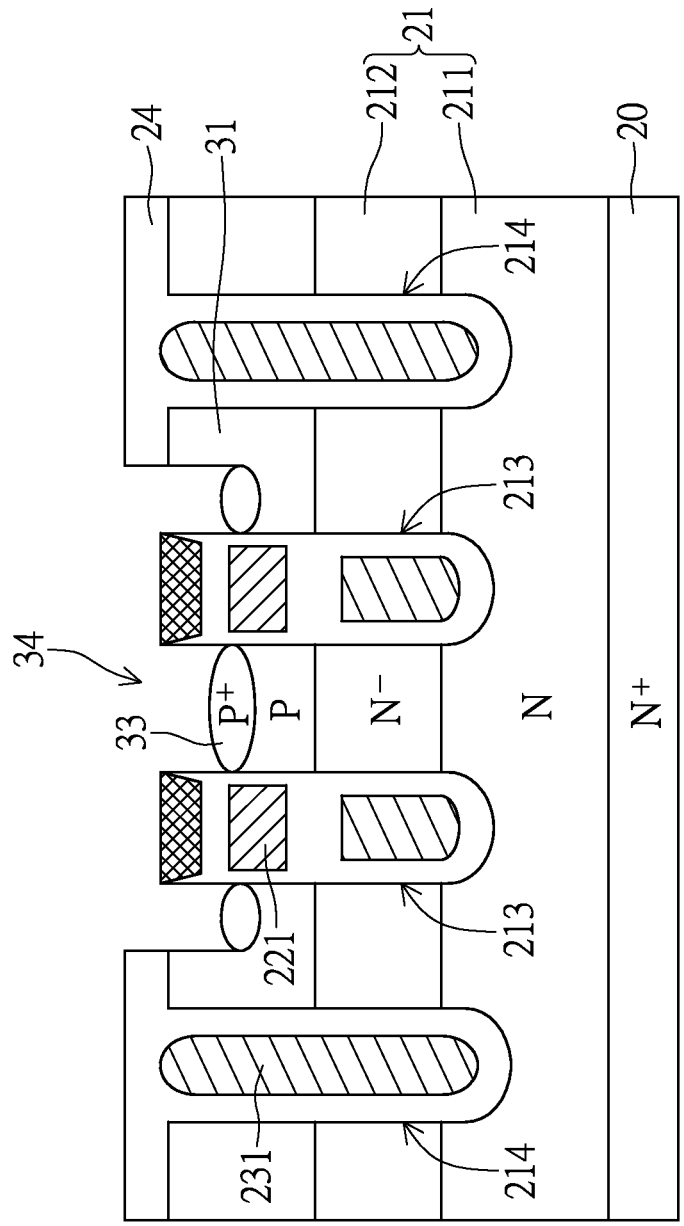

To clarify the method of forming the body, source, and heavy body regions 33, refer to FIG. 12 through FIG. 14, which are cross-sectional views illustrating the processing steps of the method. As shown in FIG. 12, an implantation process is conducted to dope the second epitaxial layer 21 to form the body region 31 after the formation of the cap strip 226. The implantation parameters include, but are not limited to, implantation of boron to a dose of 6e12 at/$cm^2$ at energy of 120-180 keV. A subsequently thermal drive-in process can be performed on the body region 31 to achieve a predetermined junction depth.

Next, another implantation process is conducted to dope the second epitaxial layer 21 to form a plurality of source regions 32 in the body region 31. The implantation parameters include, but are not limited to, implantation of arsenic to a dose range of 1e15-8e15 at/$cm^2$ at energy of 40-60 keV. Similarly, a subsequent thermal drive-in process can be performed on the source regions 32 to achieve a predetermined junction depth.

As shown in FIG. 13 and FIG. 14, next, an interlayer dielectric layer 24 is formed on the second epitaxial layer 212 to cover the gate and termination structures 22, 23 and the source and heavy body regions 32, 33. The interlayer dielectric layer 24 may include, but is not limited to, oxide, boron phosphorus silicon glass (BPSG), or a combination thereof. The interlayer dielectric layer 24 can be formed by a high-density plasma chemical vapor deposition process (HD-PCVD) or a chemical vapor deposition process (CVD).

Next, a patterned photoresist layer (not shown) is formed on the termination structure 23, and a subsequent etching process is performed on the uncovered interlayer dielectric layer 24 to form a plurality of contact windows 34. After that, an implantation process is conducted to dope the second epitaxial layer 21 to form a plurality of heavy body regions 33 adjacent to the source regions 32. The implantation parameters include, but are not limited to, implantation of boron difluoride ($BF_2$) to a dose range of 1e15-3e15 at/$cm^2$ at an energy of 40-60 keV. Similarly, a subsequent thermal drive-in process can be performed on the heavy body regions 33 to achieve a predetermined junction depth. It should be noted that the cap tripe 226 can acts as an alignment mask to define the landing areas of the source or heavy body regions 32, 33 during implanting. Accordingly, the source or heavy body regions 33 can be formed to accurately dispose at intervals of the first trench 213.

Referring again to FIGS. 1-3 and FIGS. 5-6 as well, the patterned conductive layer 25 is formed on the interlayer dielectric layer 24. The patterned conductive layer 25 can be made of titanium (Ti), titanium nitride (TiN), Tungsten (W), aluminum-silicon alloy (Al—Si) or aluminum-silicon-copper alloy (Al—Si—Cu), etc., but is not limited to said materials. Specifically, the patterned conductive layer 25 includes a source metal layer 251 disposed in the conductive source area 11 and a gate metal layer 252 disposed in the conductive gate region 12 (shown in FIG. 1). Moreover, the contact windows 34 are filled up with the source metal layer (shown in FIG. 2 and FIG. 3). Accordingly, the source metal layer 251 can electrically contact the source and heavy body regions 32, 33.

Referring again to FIG. 1 together with FIG. 4, there is no contact window 34 formed in the conductive gate region 11. It should be noted that the gate metal layer 252 can electrically contact the gate electrode 221 of the gate structure 22 and the termination electrode 231 of the termination structure 23 in the conductive gate region 11 by at least a first contact plugs 35 and at least a second contact plugs 36 respectively.

To clarify the method of forming the first and second contact plugs 35, 36. It should be noted that at least a first contact hole 351 and at least a second contact hole 361 can be formed at the time of the formation of the contact windows 34. The first contact hole 351 extends through the interlayer dielectric layer 24, and the cap strip 226 and the gate dielectric layer 224 of the gate structure 22 to expose the gate electrode 221. The second contact hole 361 extends through the interlayer dielectric layer 24 and a portion of the insulating layer 232 of the termination electrode 231 to expose the termination electrode 321. Next, each of the first and second contact holes 351, 361 are filled up with effective cavity-filling and low resistance metal elements 352, 362 (ex. tungsten element) respectively. It should be noted that an importation process is performed on the first and second contact holes 351, 361 to form ohmic contacts between the first and second contact plug 35, 36 and the gate and termination electrodes 221, 231.

After that, a chemical mechanical polishing (CMP) process is performed on each metal element 352, 362 to form a common plane with the top surface of the interlayer dielectric layer 24. Consequently, there are first and second contact plugs 35, 36 formed in the contact areas 14 (shown in FIG. 1), and the first and second contact plugs 35, 36 can acts as buried wires of gate metal layer 252 to reduce gate input resistance (shown in FIG. 4).

Based on the above, the power semiconductor device having low on-state resistance, in comparison with the conventional power semiconductor device, includes a plurality of contact plugs which are configured to act as buried wire of the gate metal. Hence, the low input resistance of gate can be provided, and there is no need to divide the source metal so that the source metal having a relatively large effective area is good for packaging and wire bonding processes.

In addition, the device layout is constituted by a rectangular-shaped trench termination structure and at least two stripe-shaped trench gate structures disposed inside the trench termination structure. The trench termination structure includes a termination gate and an insulating dielectric disposed between the termination gate and the sidewalls of the trench. Each of the trench gate structures includes a gate electrode and a shielding electrode disposed under the gate electrode. Therefore, the miniaturization of the power semiconductor device having low on-state resistance can be achieved. Besides, the thick-film oxide layer, in the non-conducting state, can be subjected to high electric field to improve the breakdown voltage. Thus, the concentration of the epitaxial layer can be increased to reduce the on-state resistance.

The most important thing is that when the gate and shielding electrodes receives an external gate voltage, an electric current is in close proximity to each gate structure. Accordingly, a wide channel of current flow can be formed between the two adjacent trench gate structures, and the narrow channel effect (pitch-off effect) can be reduced.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A power semiconductor device having low on-state resistance, comprising:
    a substrate having a conductive gate area defined thereon;
    an epitaxial layer disposed on the substrate, having at least a first trench and a second trench;
    a gate structure disposed in the first trench, wherein the gate structure includes a gate electrode, a shield electrode disposed under the gate electrode, and an insulating dielectric over the gate and shield electrodes, and wherein the gate structure comprises a cap stripe disposed over the gate electrode and the cap stripe is made of silicon nitride ($Si_3N_4$);
    a termination structure disposed in the second trench, wherein the termination structure includes a termination electrode and an insulating dielectric over the termination electrode;
    a body region formed in epitaxial layer and around the first and second trenches;
    an interlayer dielectric layer disposed on the body region; and
    a patterned conductive layer disposed on the interlayer dielectric layer, configured to electrically contact the gate electrode of the gate structure and the termination electrode of the termination structure in the conductive gate area by a first contact plug and a second contact plug respectively;
    wherein the shield electrode of the gate structure and the termination electrode of the termination structure are configured to tie a gate voltage source.

2. The power semiconductor device having low on-state resistance according to claim 1, further comprising a plurality of source regions disposed in the body region and at intervals of the first trench and a plurality of heavy body regions disposed at intervals of the first trench along a first direction and the source regions along a second direction which is perpendicular to the first direction.

3. The power semiconductor device having low on-state resistance according to claim 1, wherein the epitaxial layer is divided into a first epitaxial layer disposed on the substrate and a second epitaxial layer disposed on the first epitaxial layer, the substrate and the first and second epitaxial layers have a first conductivity type, the substrate has a higher doping concentration than the first epitaxial layer, and the first epitaxial layer has a higher doping concentration than the second epitaxial layer.

4. The power semiconductor device having low on-state resistance according to claim 1, wherein the substrate has a conductive source area defined thereon and at a distance of the conductive gate area, the interlayer dielectric layer, the cap stripe and the gate dielectric layer of the gate structure in the conductive gate area comprise a first contact hole to expose the gate electrode of the gate structure, and the first contact hole is filled up with the metal element to form the first contact plug.

5. The power semiconductor device having low on-state resistance according to claim 4, wherein the interlayer dielectric layer and the insulating layer of the termination structure in the conductive gate area comprise a second contact hole to expose the termination electrode of the termination structure, and the second contact hole is filled up with the metal element to form the second contact plug.

6. The power semiconductor device having low on-state resistance according to claim 1, wherein the body region is formed by a dose of 6e12 at/$cm^2$, the source regions are formed by a dose range of 1e15-8e15 at/$cm^2$, and the heavy body regions are formed by a dose range of 1e15-3e15 at/$cm^2$.

7. The power semiconductor device having low on-state resistance according to claim 1, wherein the substrate is configured to act as a drain electrode layer.

8. The power semiconductor device having low on-state resistance according to claim 7, wherein the substrate has a conductive source area defined thereon and at a distance of the conductive gate area, the patterned conductive layer includes a source metal layer disposed in the conductive source region and a gate metal layer disposed in the conductive gate region.

9. The power semiconductor device having low on-state resistance according to claim 8, the interlayer dielectric layer and the body region comprises a plurality of contact windows in the conductive source area corresponding to the source and heavy body regions, and the contact windows are filled up with the source metal layer.

* * * * *